(12) United States Patent
Lee et al.

(10) Patent No.: US 12,300,292 B2
(45) Date of Patent: May 13, 2025

(54) MAGNETIC RANDOM ACCESS MEMORY STRUCTURE

(71) Applicant: Industrial Technology Research Institute, Hsinchu (TW)

(72) Inventors: Hsin-Han Lee, Hsinchu (TW); Jeng-Hua Wei, Taipei (TW); Shan-Yi Yang, Hsinchu (TW); Yu-Chen Hsin, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 333 days.

(21) Appl. No.: 18/146,255

(22) Filed: Dec. 23, 2022

(65) Prior Publication Data

US 2024/0177756 A1    May 30, 2024

(30) Foreign Application Priority Data

Nov. 30, 2022  (TW) .................................. 111145782

(51) Int. Cl.
| | | |
|---|---|---|
| *G11C 11/00* | (2006.01) | |
| *G11C 11/16* | (2006.01) | |
| *H10B 61/00* | (2023.01) | |
| *H10N 50/10* | (2023.01) | |
| *H10N 50/80* | (2023.01) | |

(52) U.S. Cl.
CPC ........ *G11C 11/161* (2013.01); *G11C 11/1673* (2013.01); *G11C 11/1675* (2013.01);
(Continued)

(58) Field of Classification Search
CPC ......... G11C 11/16; G11C 11/15; H01L 43/08; H01L 27/228
(Continued)

(56) References Cited

U.S. PATENT DOCUMENTS

| | | |
|---|---|---|
| 9,218,864 B1 | 12/2015 | Yi et al. |
| 10,483,457 B1 | 11/2019 | Lee et al. |

(Continued)

FOREIGN PATENT DOCUMENTS

| | | |
|---|---|---|
| CN | 101290947 A | 10/2008 |
| CN | 109427381 A | 3/2019 |

(Continued)

OTHER PUBLICATIONS

Taiwanese Office Action and Search Report for Taiwanese Application No. 111145782, dated Jul. 27, 2023.
(Continued)

*Primary Examiner* — Son T Dinh
(74) *Attorney, Agent, or Firm* — Birch, Stewart, Kolasch & Birch, LLP

(57) ABSTRACT

A magnetic random access memory (MRAM) structure is provided. The MRAM structure includes a first write electrode, a first magnetic tunnel junction (MTJ) stack, a voltage control electrode, a second MTJ stack, and a second write electrode. The first MTJ stack includes a first free layer disposed on the first write electrode, a first tunnel barrier layer disposed on the first free layer, and a first fixed layer disposed on the first tunnel barrier layer. The voltage control electrode is disposed on the first MTJ stack. The second MTJ stack includes a second fixed layer disposed on the voltage control electrode, a second tunnel barrier layer disposed on the second fixed layer, and a second free layer disposed on the second tunnel barrier layer. The second write electrode is disposed on the second MTJ stack.

20 Claims, 10 Drawing Sheets

(52) U.S. Cl.
CPC .......... *G11C 11/1697* (2013.01); *H10B 61/22* (2023.02); *H10N 50/10* (2023.02); *H10N 50/80* (2023.02)

(58) Field of Classification Search
USPC ........................................ 365/158, 171, 173
See application file for complete search history.

(56) References Cited

U.S. PATENT DOCUMENTS

| | | | |
|---|---|---|---|
| 10,790,441 B2 * | 9/2020 | Camsari | ................. H10N 50/85 |
| 10,978,234 B2 | 4/2021 | Chatterjee et al. | |
| 2003/0214838 A1 | 11/2003 | Smith | |
| 2018/0308536 A1 | 10/2018 | Buhrman et al. | |

FOREIGN PATENT DOCUMENTS

| | | |
|---|---|---|
| TW | I705438 B | 9/2020 |
| WO | WO 2020/172891 A1 | 9/2020 |
| WO | WO 2021/142681 A1 | 7/2021 |

OTHER PUBLICATIONS

Cao et al., "Prospect of Spin-Orbitronic Devices and Their Applications", iScience, Oct. 23, 2020, vol. 23, 101614, pp. 1-22.

Grimaldi et al., "Single-shot dynamics of spin-orbit torque and spin transfer torque switching in three-terminal magnetic tunnel junctions", Nature Nanotechnology, Feb. 2020, vol. 15, pp. 111-117, total 17 pages.

Wu et al., "Deterministic and field-free voltage-controlled MRAM for high performance and low power applications", IEEE Symposium on VLSI Technology Digest of Technical Papers, 2020, total 2 pages.

Wu et al., "Voltage-Gate Assisted Spin-Orbit Torque Magnetic Random Access Memory for High-Density and Low-Power Embedded Application", arXiv, 2021, pp. 1-10.

Yoda et al., "Voltage-Control Spintronics Memory (VoCSM) Having Potentials of Ultra-Low Energy-Consumption and High-Density", IEEE International Electron Devices Meeting (IEDM), 2016, total 4 pages.

* cited by examiner

MAGNETIC RANDOM ACCESS MEMORY STRUCTURE

CROSS REFERENCE TO RELATED APPLICATIONS

This application claims priority of Taiwan Patent Application No. 111145782, filed on Nov. 30, 2022, the entirety of which is incorporated by reference herein.

TECHNICAL FIELD

The present disclosure relates to a magnetic random access memory structure, and, in particular, to a magnetic random access memory structure using a magnetic tunnel junction.

BACKGROUND

A magnetic random access memory (MRAM) is a nonvolatile memory (NVM) based on a magnetic tunnel junction (MTJ). MRAM can offer comparable performance to volatile static random access memory (SRAM) and comparable density to volatile dynamic random access memory (DRAM) with lower power consumption than DRAM.

During the development of MRAM, many different types of MRAM devices have appeared. These MRAM devices each have their own disadvantages, however. For example, the MRAM device that uses a spin transfer torque (STT) mechanism performs worse in terms of reliability. The MRAM device that uses a spin orbit torque (SOT) mechanism requires a higher write current, which in turn requires a larger select transistor and thus takes up more space. Although the MRAM device that uses a voltage control magnetic anisotropy (VCMA) mechanism can reduce the write current, it still has an issue with retention being too short. Therefore, although existing MRAM devices are generally adequate for their intended purposes, they have not been entirely satisfactory in all respects.

SUMMARY

An embodiment of the present disclosure provides a magnetic random access memory (MRAM) structure. The MRAM structure comprises a first write electrode, a first magnetic tunnel junction (MTJ) stack, a voltage control electrode, a second MTJ stack, and a second write electrode. The first MTJ stack includes a first free layer disposed on the first write electrode, a first tunnel barrier layer disposed on the first free layer, and a first fixed layer disposed on the first tunnel barrier layer. The voltage control electrode is disposed on the first MTJ stack. The second MTJ stack includes a second fixed layer disposed on the voltage control electrode, a second tunnel barrier layer disposed on the second fixed layer, and a second free layer disposed on the second tunnel barrier layer. The second write electrode is disposed on the second MTJ stack.

An embodiment of the present disclosure provides a magnetic random access memory (MRAM) structure. The MRAM structure comprises a first voltage control electrode, a first magnetic tunnel junction (MTJ) stack, a write electrode, a second MTJ stack, and a second voltage control electrode. The first MTJ stack includes a first fixed layer disposed on the first voltage control electrode, a first tunnel barrier layer disposed on the first fixed layer, and a first free layer disposed on the first tunnel barrier layer. The write electrode is disposed on the first MTJ stack. The second MTJ stack includes a second free layer disposed on the write electrode, a second tunnel layer disposed on the second free layer, and a second fixed layer disposed on the second tunnel barrier layer. The second voltage control electrode is disposed on the second MTJ stack.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF DISCLOSED EMBODIMENTS

Figure 1:
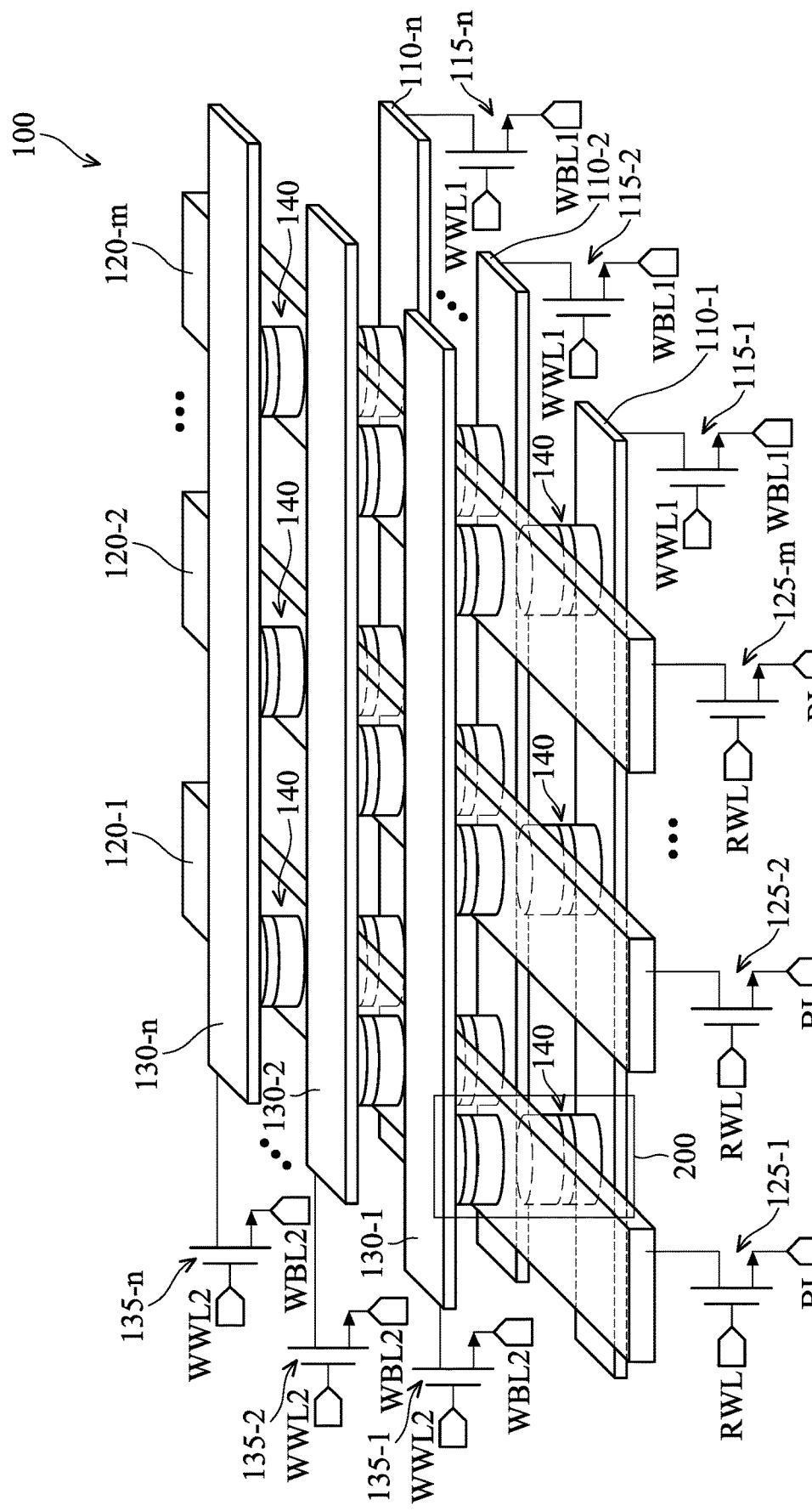
FIG. 1 illustrates a schematic diagram of an MRAM array, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure provide a magnetic random access memory (MRAM) structure including a magnetic tunnel junction (MTJ). This MRAM structure utilizes a voltage-gate assisted SOT (VG-SOT) mechanism that combines a spin orbit torque (SOT) and a voltage control magnetic anisotropy (VCMA). It can provide advantages of both SOT-MRAM and VCMA-MRAM simultaneously, that is, low power consumption and high retention. Furthermore, the MRAM structure provided by the embodiments of the present disclosure can be applied to a high density three-dimensional MRAM array, and can increase the consistency of the magnitude of the write current (also referred to as switching current) of each MRAM cell (also referred to as bit cell) in the MRAM array at the same time. As a result, the reliability and the yield of the three-dimensional MRAM array can be increased.

One bit cell of an MRAM device includes an MTJ stack vertically disposed between electrodes. The MTJ stack includes free layer, a tunnel barrier layer, and a fixed layer separated from the free layer by the tunnel barrier layer. In the MTJ stack, the magnetic orientation of the fixed layer is static (i.e., fixed), while the magnetic orientation of the free layer is capable of switching between a parallel configuration and an anti-parallel configuration with respect to that of the fixed layer. The parallel configuration provides for a low resistance state that digitally stores data as a first bit value (e.g., a logical "0"). The anti-parallel configuration provides for a high resistance state that digitally stores data as a second bit value (e.g., a logical "1"). The switching between the two configurations provides two magnetic states of the MTJ stack. The magnetic state of the MTJ stack is set by applying a write current with appropriate amplitude and polarity, or read out by applying a read current to sense the magnitude of the resistance.

FIG. 1 illustrates a schematic diagram of an MRAM array 100, in accordance with some embodiments of the present disclosure. The MRAM array 100 includes first write electrodes 110-1, 110-2, . . . , 110-*n*; voltage control electrodes 120-1, 120-2, . . . , 120-*m*; and second write electrodes 130-1, 130-2, . . . , 130-*n*, wherein n and m are any of positive integers. For the purpose of simplicity and clarity, the first write electrodes 110-1~110-*n* can be collectively referred to as the first write electrodes 110, the voltage control electrodes 120-1~120-*m* can be collectively referred to as the voltage control electrodes 120, and the second write electrodes 130-1~130-*n* can be collectively referred to as the second write electrodes 130.

Refer to FIG. 1, the first write electrodes 110 extend in the X direction. The voltage control electrodes 120 extend in the Y direction (which is substantially perpendicular to the X direction) and are disposed over the first write electrodes 110. At the intersection of each of the first write electrodes 110 and each of the voltage control electrodes 120, one of the MRAM bit cells 140 is disposed, wherein the MRAM bit cells 140 are disposed on the first write electrodes 110, and the voltage control electrodes 120 are disposed on the MRAM bit cells 140. The second write electrodes 130 extend in the X direction, and are disposed over the voltage control electrodes 120. At the intersection of each of the voltage control electrodes 120 and each of the second write electrodes 130, one of the MRAM bit cells 140 is disposed, wherein the MRAM bit cells 140 are disposed on the voltage control electrodes 120, and the second write electrodes 130 are disposed on the MRAM bit cells 140. Each of the MRAM bit cells 140 includes one MTJ stack and can store one bit of data.

The first write electrodes 110-1~110-*n* are connected to the first sources/drains of first write transistors 115-1~115-*n*, respectively. The second sources/drains of the first write transistors 115-1~115-*n* are connected to first write bit lines WBL1, and gates of the first write transistors 115-1~115-*n* are connected to first write word lines WWL1. The voltage control electrodes 120-1~120-*m* are connected to the first sources/drains of read transistors 125-1~125-*m*, respectively. The second sources/drains of the read transistors 125-1~125-*m* are connected to bit lines BL, and gates of the read transistors 125-1~125-*m* are connected to read word lines RWL. The second write electrodes 130-1~130-*n* are connected to the first sources/drains of second write transistors 135-1~135-*n*, respectively. The second sources/drains of the second write transistors 135-1~135-*n* are connected to second write bit lines WBL2, and gates of the second write transistors 135-1~135-*n* are connected to second write word lines WWL2. For the purpose of simplicity and clarity, the first write transistors 115-1~115-*n* can be collectively referred to as the first write transistors 115, the read transistors 125-1~125-*m* can be collectively referred to as the read transistors 125, and the second write transistors 135-1~135-*n* can be collectively referred to as the second write transistors 135.

The MRAM bit cells 140 to be written/read can be selected by turning on or turning off the first write transistors 115, the read transistors 125, and the second write transistors 135 respectively connected to the first write electrodes 110, the voltage control electrodes 120, and the second write electrodes 130. For example, the MRAM bit cell 140 between the first write electrode 110-1 and the voltage control electrode 120-1 may be selected by the first write transistor 115-1 and the read transistor 125-1. The MRAM bit cell 140 between the second write electrode 130-*n* and the voltage control electrode 120-*m* may be selected by the second write transistor 135-*n* and the read transistor 125-*m*.

The first write electrodes 110 and the second write electrodes 130 may be used to provide the write currents for the MRAM bit cells 140 to change the bit values stored in the MRAM bit cells 140 by switching the magnetic orientation of the free layers in the MRAM bit cells 140. The voltage control electrodes 120 may be used to apply the control voltages to the MRAM bit cells 140 to reduce the write current required for switching the free layers in the MRAM bit cells 140.

The writing of the MRAM bit cells 140 may be performed by the following method: providing voltages by the first write word lines WWL1/the second write word lines WWL2 to turn on the first write transistors 115/the second write transistors 135; providing write currents by the first write bit lines WBL1/the second write bit lines WBL2, so that the write currents flow through the MRAM bit cells 140 via the first write electrodes 110/the second write electrodes 130; providing voltages by the read word lines RWL to turn on the read transistors 125; and providing control voltages to the voltage control electrodes 120 by the bit lines BL to reduce the write currents required for the MRAM bit cells 140.

The reading of the MRAM bit cells 140 may be performed using the following methods: turning on the first write transistors 115/the second write transistors 135 and the read transistors 125; the bit lines BL provide read currents to make the read currents penetrate the MTJ stacks in the MRAM bit cells 140; and determining the bit values stored in the MRAM bit cells 140 by sensing the amplitude (high/low) of resistance in the MRAM bit cells 140.

Figure 2:
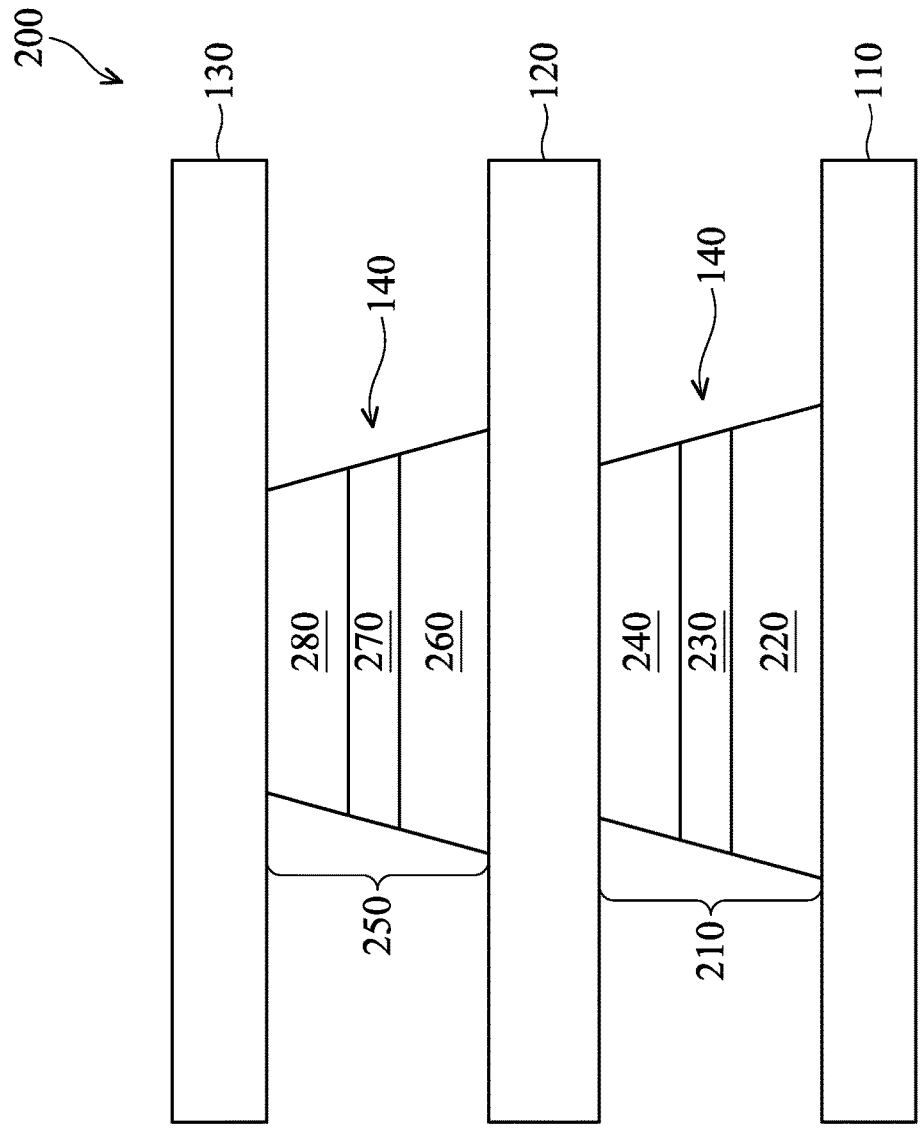
FIG. 2 illustrates a schematic diagram of a memory structure, in accordance with some embodiments of the present disclosure.

FIG. 2 further illustrates a memory structure 200. One memory structure 200 includes the first write electrode 110, the first MRAM bit cell 140 disposed on the first write electrode 110, the voltage control electrode 120 disposed on the first MRAM bit cell 140, the second MRAM bit cell 140 disposed on the voltage control electrode 120, and the second write electrode 130 disposed on the second MRAM bit cell 140. The present disclosure will be described below with reference to the memory structure 200.

FIG. 2 illustrates a schematic diagram of the memory structure 200, in accordance with some embodiments of the present disclosure. Refer to FIG. 2, the first MRAM bit cell 140 between the first write electrode 110 and the voltage control electrode 120 includes a first MTJ stack 210, and the second MRAM bit cell 140 between the voltage control electrode 120 and the second write electrode 130 includes a second MTJ stack 250. It should be noted that, for the purpose of simplicity, the present disclosure only uses MTJ stacks to represent MRAM bit cells. In fact, the MRAM bit cell may include many other elements, such as various insulating layers, dielectric layers, spacer layers, liner layers, contacts, vias, and the like.

In some embodiments, the first MTJ stack 210 includes a first free layer 220 disposed on the first write electrode 110, a first tunnel barrier layer 230 disposed on the first free layer 220, and a first fixed layer 240 disposed on the first tunnel barrier layer 230. The voltage control electrode 120 is disposed on the first MTJ stack 210. The second MTJ stack 250 includes a second fixed layer 260 disposed on the voltage control electrode 120, a second tunnel barrier layer 270 disposed on the second fixed layer 260, and a second free layer 280 disposed on the second tunnel barrier 270. The second write electrode 130 is disposed on the second MTJ stack 250.

In some embodiments, the first write electrode 110 and the second write electrode 130 may include metal materials capable of producing a spin hall effect or topological insulator materials capable of producing a quantum spin hall effect, such as tantalum (Ta), platinum (Pt), tungsten (W), or alloys thereof, alternatively, bismuth (Bi), antimony (Sb), tellurium (Te), or alloys thereof. The voltage control electrode 120 may include a conductive material, such as titanium (Ti), tantalum (Ta), platinum (Pt), ruthenium (Ru), tungsten (W), aluminum (Al), copper (Cu), TiN, TaN, other suitable materials, and/or combinations thereof.

In some embodiments, the first free layer 220 and the second free layer 280 may include ferromagnetic materials, such as iron (Fe), cobalt (Co), nickel (Ni), gadolinium (Gd), terbium (Tb), dysprosium (Dy), boron (B), CoFeB, NF, FeB, CoFeTa, NiFe, CoFe, CoPt, PtMn, IrMn, RhMn, FeMn, OsMn, other suitable materials, alloys thereof, and/or combinations thereof. The first tunnel barrier layer 230 and the second tunnel barrier layer 270 may include magnesium oxide (MgO), aluminum oxide ($Al_2O_3$), aluminum nitride (AlN), aluminum oxynitride (AlON), hafnium oxide ($HfO_2$), or zirconia ($ZrO_2$).

The first fixed layer 240 and the second fixed layer 260 may be single-layer or multi-layer structures. The first fixed layer 240 and the second fixed layer 260 may include ferromagnetic material layers, wherein the ferromagnetic material layers may include those ferromagnetic materials previously described with reference to the first free layer 220 and the second free layer 280. In some embodiments, the first fixed layer 240 and the second fixed layer 260 further include antiferromagnetic layers, wherein the antiferromagnetic layers are used to fix the magnetic orientation of the ferromagnetic material layers in the first fixed layer 240 and the second fixed layer 260. The antiferromagnetic layers include materials such as ruthenium (Ru), iridium (Ir), or other suitable materials. The ferromagnetic material layer in the first fixed layer 240 may be located between the antiferromagnetic layer and the first tunnel barrier layer 230, and the ferromagnetic material layer in the second fixed layer 260 may be located between the antiferromagnetic layer and the second tunnel barrier layer 270.

Figure 3A:
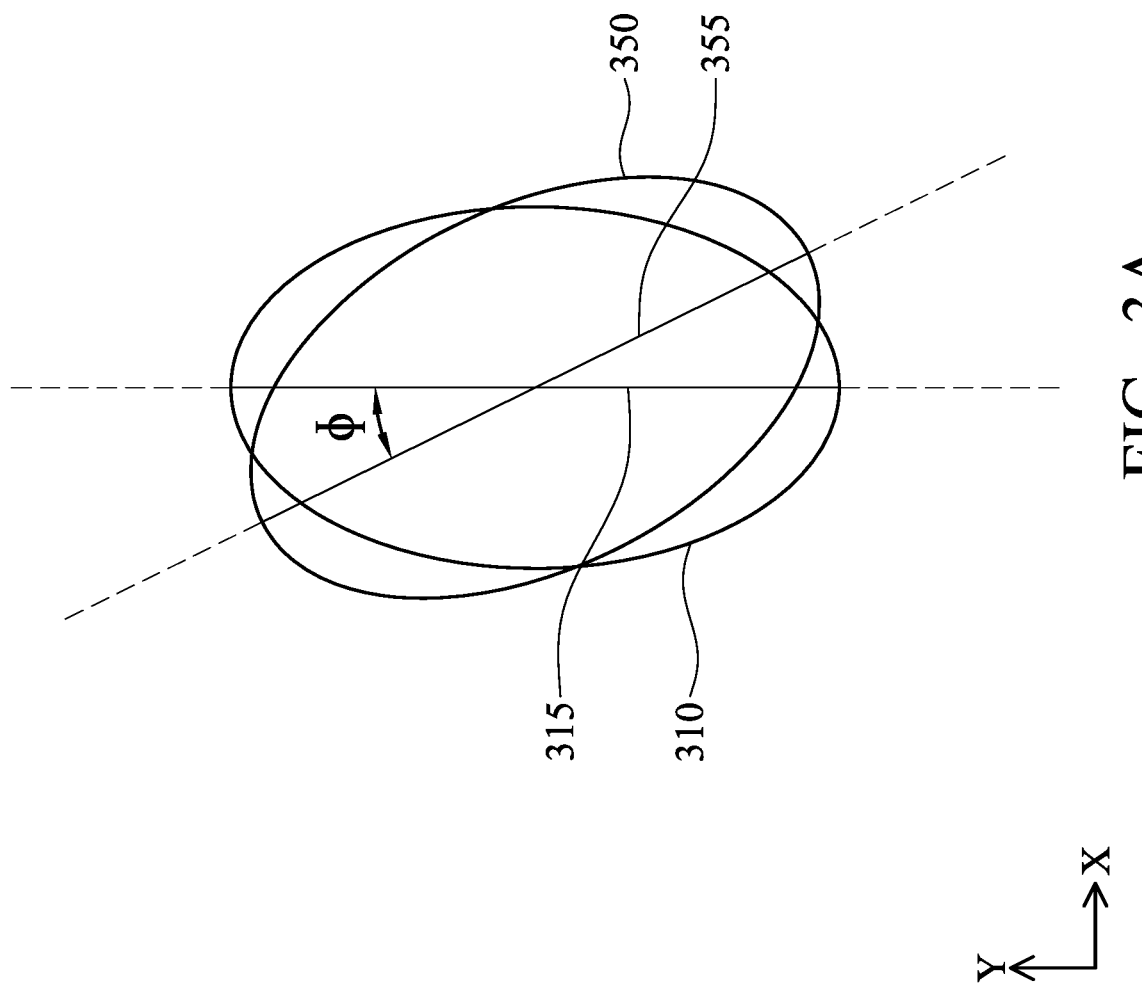
FIGS. 3A and 3B illustrate top views of the memory structure on an X-Y plane, in accordance with some embodiments of the present disclosure.
Figure 3B:
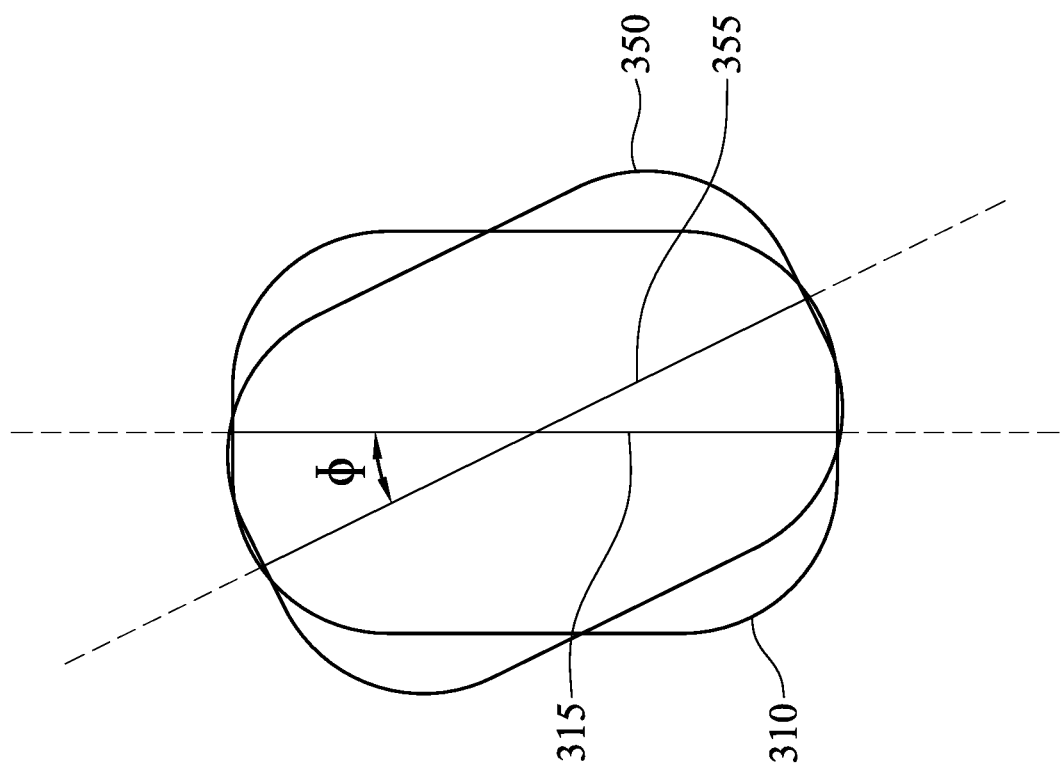

FIGS. 3A and 3B illustrate top views of the memory structure 200 on an X-Y plane, in accordance with some embodiments of the present disclosure. In some embodiments, the first MTJ stack 210 has a first projection 310 on the X-Y plane, and the second MTJ stack 250 has a second projection 350 on the X-Y plane. The shape of the first projection 310 on the X-Y plane includes a first major axis 315 and a first minor axis (not shown), and the shape of the second projection 350 on the X-Y plane includes a second major axis 355 and a second minor axis (not shown). In some embodiments, the first projection 310 and the second projection 350 are elliptical, as shown in FIG. 3A. In some embodiments, the first projection 310 and the second projection 350 are rounded rectangular, as shown in FIG. 3B. However, the shapes of the first projection 310 and the second projection 350 in the present disclosure are not limited to the enumerated ellipse or rounded rectangle.

In some embodiments, the second MTJ stack 250 is rotated at an angle relative to the underlying first MTJ stack 210. Since the second MTJ stack 250 is rotated by the angle relative to the first MTJ stack 210, there is an included angle Φ between the second major axis 355 of the second projection 350 of the second MTJ stack 250 and the first major axis 315 of the first projection 310 of the first MTJ stack 210, as shown in FIG. 3A and FIG. 3B. In some embodiments, the included angle Φ is from −50 degrees to 50 degrees, such as −50 degrees to −5 degrees and 5 degrees to 50 degrees, or −50 degrees to −30 degrees and 30 degrees to 50 degrees.

In general, since the process procedure is not completely ideal, the flatness of the bottom layer of the formed MTJ stack is better, but the flatness of the top layer of the formed MTJ stack is not as better. For example, the first free layer 220 at the bottom of the first MTJ stack 210 and the second fixed layer 260 at the bottom of the second MTJ stack 250 are flatter, while the first fixed layer 240 at the top of the first MTJ stack 210 and the second free layer 280 at the top of the second MTJ stack 250 are not as flat, as shown in FIG. 4.

A layer that is not as flat will lead to the interface between that layer and the electrode connected to it also not being as flat. For example, the interface between the second free layer 280 and the second write electrode 130 thereon has worse flatness. For the fixed layer (e.g., the first fixed layer 240), since the function of the voltage control electrode connected to the fixed layer is to provide a voltage to reduce the difficulty of switching the magnetic orientation of the free layer, the flatness of the interface between the fixed layer and the voltage control electrode has less influence on the performance of the MTJ stack.

However, for the free layer (e.g., the second free layer 280), since the write electrode connected to the free layer needs to switch the magnetic orientation of the free layer by the current flowing horizontally, the influence of the flatness of the interface between the free layer and the write electrode on the performance of the MTJ stack cannot be ignored. In the MTJ stack that the interface between the free layer and the write electrode has worse flatness, the relatively greater write current (also referred to as switching current) is required to switch the magnetic orientation of the free layer.

Figure 4:
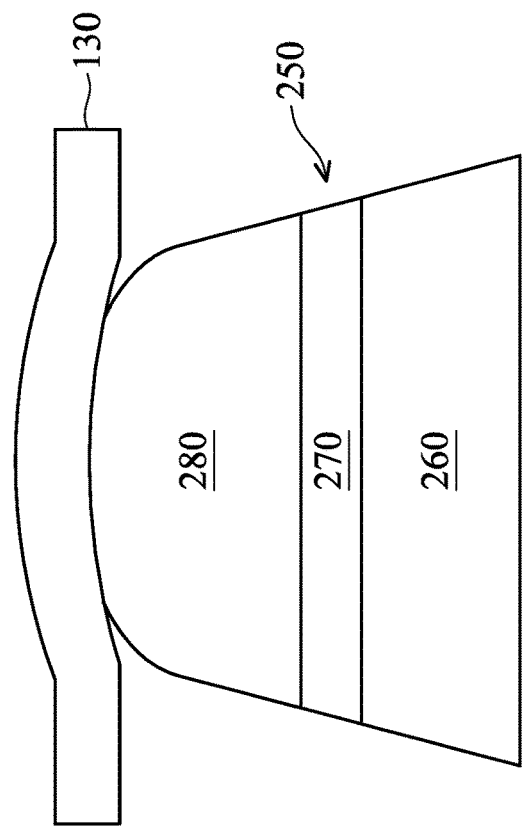
FIG. 4 illustrates a schematic diagram of the flatness of layers in MTJ stacks and electrodes, in accordance with some embodiments of the present disclosure.
Figure 4:
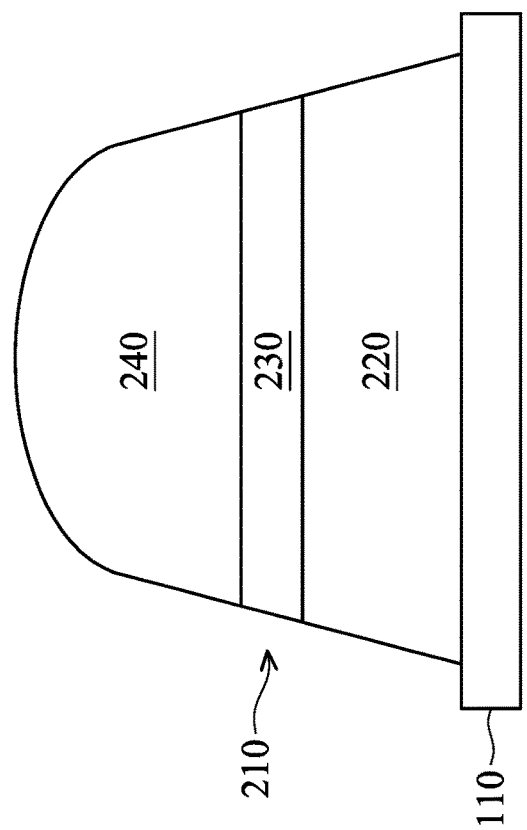

In the embodiment shown in FIG. 4, the interface between the second free layer 280 and the second write electrode 130 thereon has worse flatness. Therefore, in terms of switching the magnetic orientation, the write current required by the second free layer 280 of the second MTJ stack 250 is greater than the write current required by the first free layer 220 of the first MTJ stack 210. This will result in that in the MRAM array, different MRAM bit cells require different write currents. As a result, the operation complexity will be increased, or the failure rate of the MRAM array will be increased and thus the reliability of the MRAM array will be reduced.

Returning to FIGS. 3A and 3B, through rotating an MTJ stack that has a free layer on the top and a write electrode disposed on the free layer at an angle, the write current required by the MTJ stack can be reduced. For example, through rotating the second MTJ stack 250 relative to the first MTJ stack 210 by the included angle Φ, the write current required by the second free layer 280 of the second MTJ stack 250 can be reduced. As a result, the increasing write current caused by the worse flatness of the interface between the second free layer 280 and the second write electrode 130 thereon can be compensated. In some embodiments, as the absolute value of the included angle Φ increases, the writing current required to switch the free layer can decrease accordingly. By adjusting the rotating angle of the MTJ stack, the write current required by the MTJ stack can be flexibly modified. In this way, each MRAM bit cell in the entire MRAM array may have the same write current as much as possible. Alternatively, the write currents of different MRAM bit cells in the MRAM array can be separately modified according to usage requirements.

Figure 5:
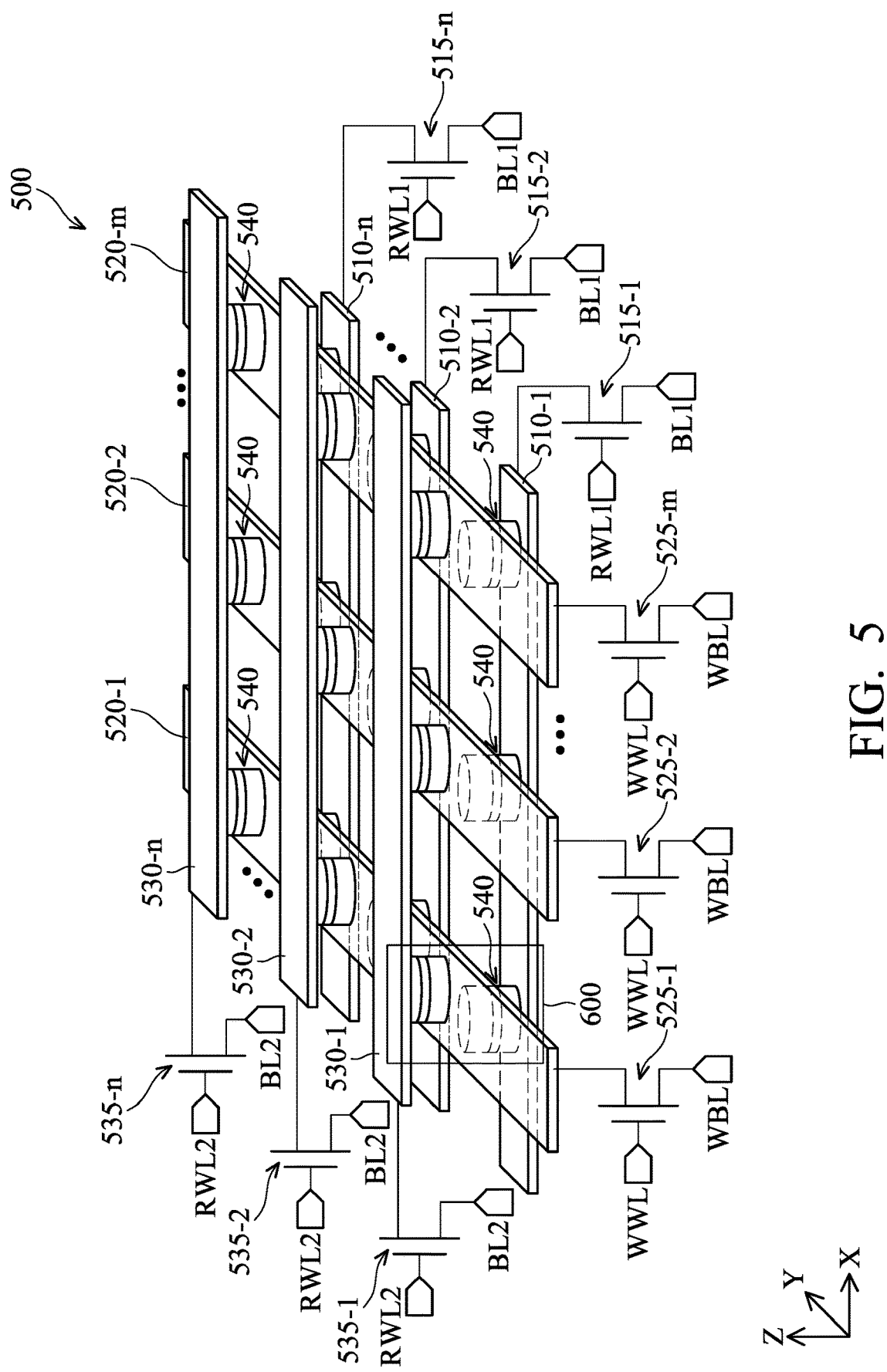
FIG. 5 illustrates a schematic diagram of an MRAM array, in accordance with some embodiments of the present disclosure.

FIG. 5 illustrates a schematic diagram of an MRAM array 500, in accordance with some embodiments of the present disclosure. Refer to FIG. 5, the MRAM array 500 includes first voltage control electrodes 510-1, 510-2, . . . , 510-*n*; write electrodes 520-1, 520-2, . . . , 520-*m*; and second voltage control electrodes 530-1, 530-2, . . . , 530-*n*, wherein n and m are any of positive integers. For the purpose of simplicity and clarity, the first voltage control electrodes 510-1~510-*n* can be collectively referred to as the first voltage control electrodes 510, the write electrodes 520-1~520-*m* can be collectively referred to as the write electrodes 520, and the second voltage control electrodes 530-1~530-*n* can be collectively referred to as the second voltage control electrodes 530.

Refer to FIG. 5, the first voltage control electrodes 510 extend in the X direction. The write electrodes 520 extend in the Y direction substantially perpendicular to the X direction, and is disposed over the first voltage control electrodes 510. At the intersection of each of the first voltage control electrodes 510 and each of the write electrodes 520, one of the MRAM bit cells 540 is disposed, wherein the MRAM bit cells 540 are disposed on the first voltage control electrodes 10, and the write electrodes 520 are disposed on the MRAM bit cells 540. The second voltage control electrodes 530 extend in the X direction, and are disposed over the write electrodes 520. At the intersection of each of the write electrodes 520 and each of the second voltage control electrodes 530, one of the MRAM bit cells 540 is disposed, wherein the MRAM bit cells 540 are disposed on the write electrodes 520, and the second voltage control electrodes 530 are disposed on the MRAM bit cells 540. Each of the MRAM bit cells 540 includes one MTJ stack and can store one bit of data.

The first voltage control electrodes 510-1~510-*n* are connected to the first sources/drains of first read transistors 515-1~515-*n*, respectively. The second sources/drains of the first read transistors 515-1~515-*n* are connected to first bit lines BL1, and gates of the first read transistors 515-1~515-*n* are connected to first read word lines RWL1. The write electrodes 520-1~520-*m* are connected to the first sources/drains of write transistors 525-1~525-*m*, respectively. The second sources/drains of the write transistors 525-1~525-*m* are connected to write bit lines WBL, and gates of the write transistors 525-1~525-*m* are connected to write word lines WWL. The second voltage control electrodes 530-1~530-*n* are connected to the first sources/drains of second read transistors 535-1~535-*n*, respectively. The second sources/drains of the second read transistors 535-1~535-*n* are connected to second bit lines BL2, and gates of the second read transistors 535-1~535-*n* are connected to second read word lines RWL2. For the purpose of simplicity and clarity, the first read transistors 515-1~515-*n* can be collectively referred to as the first read transistors 515, the write transistors 525-1~525-*m* can be collectively referred to as the write transistors 525, and the second read transistors 535-1~535-*n* can be collectively referred to as the second read transistors 535.

The MRAM bit cells 540 to be written/read can be selected by turning on or turning off the first read transistors 515, the write transistors 525, and the second read transistors 535 respectively connected to the first voltage control electrodes 510, the write electrodes 520, and the second voltage control electrodes 530. For example, the MRAM bit cell 540 between the first voltage control electrode 510-1 and the write electrode 520-1 may be selected by the first read transistor 515-1 and the write transistor 525-1. The MRAM bit cell 540 between the second voltage control electrode 530-*n* and the write electrode 520-*m* may be selected by the second read transistor 535-*n* and the write transistor 525-*m*.

The write electrodes 520 may be used to provide the write currents for the MRAM bit cells 540 to change the bit values stored in the MRAM bit cells 540 by switching the magnetic orientation of the free layers in the MRAM bit cells 540. The first voltage control electrodes 510 and the second voltage control electrodes 530 may be used to apply the control voltages to the MRAM bit cells 540 to reduce the write current required for switching the free layers in the MRAM bit cells 540.

The writing of the MRAM bit cells 540 may be performed by the following method: providing voltages by the write word lines WWL to turn on the write transistors 525; providing write currents by the write bit lines WBL, so that the write currents flow through the MRAM bit cells 540 via the write electrodes 520; providing voltages by the first read word lines RWL1/the second read word lines RWL2 to turn on the first read transistors 515/the second read transistors 535; and providing control voltages to the first voltage control electrodes 510/the second voltage control electrodes 530 by the first bit lines BL1/the second bit lines BL2 to reduce the write currents required for the MRAM bit cells 540.

The reading of the MRAM bit cells 540 may be performed by the following methods: turning on the first read transistors 515/the second read transistors 535 and the write transistors 525; providing read currents from the first bit lines BL1/the second bit lines BL2 to make the read currents penetrate the MTJ stacks in the MRAM bit cells 540; and determining the bit values stored in the MRAM bit cells 540 by sensing the amplitude (high/low) of resistance in the MRAM bit cells 540.

Figure 6:
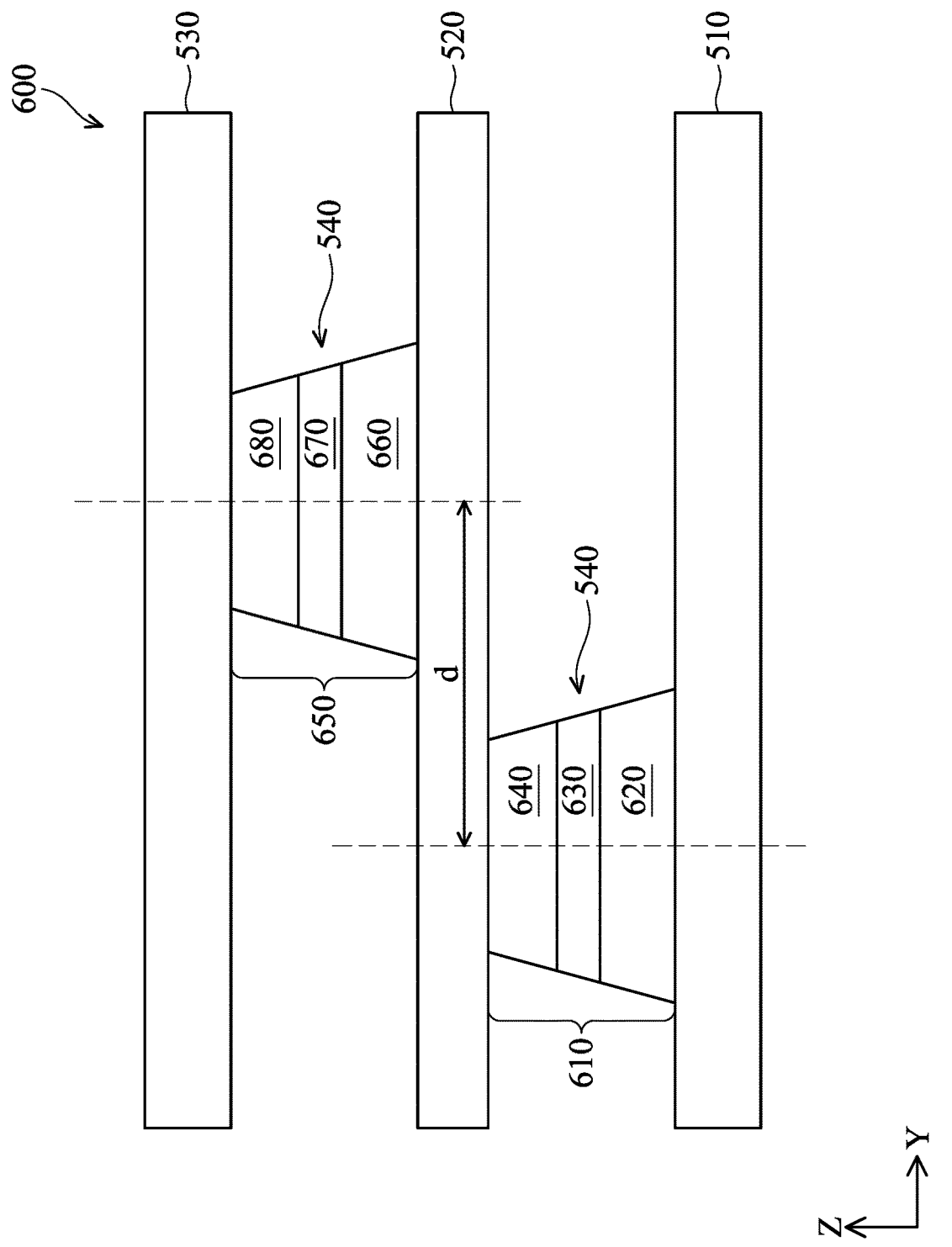
FIG. 6 illustrates a schematic diagram of a memory structure, in accordance with some embodiments of the present disclosure.

FIG. 6 further illustrates a memory structure 600. One memory structure 600 includes the first voltage control electrode 510, the first MRAM bit cell 540 disposed on the first voltage control electrode 510, the write electrode 520 disposed on the first MRAM bit cell 540, the second MRAM bit cell 540 disposed on the write electrode 520, and the second voltage control electrode 530 disposed on the second MRAM bit cell 540. The present disclosure will be described below with reference to the memory structure 600.

FIG. 6 illustrates a schematic diagram of the memory structure 600, in accordance with some embodiments of the present disclosure. Refer to FIG. 6, the first MRAM bit cell 540 between the first voltage control electrode 510 and the write electrode 520 includes a first MTJ stack 610, and the second MRAM bit cell 540 between the write electrode 520 and the second voltage control electrode 530 includes a second MTJ stack 650. As described above, for the purpose of simplicity, the present disclosure only uses MTJ stacks to represent MRAM bit cells.

In some embodiments, the first MTJ stack 610 includes a first fixed layer 620 disposed on the first voltage control electrode 510, a first tunnel barrier layer 630 disposed on the first fixed layer 620, and a first free layer 640 disposed on the first tunnel barrier layer 630. The write electrode 520 is disposed on the first MTJ stack 610. The second MTJ stack 650 includes a second free layer 660 disposed on the write electrode 520, a second tunnel barrier layer 670 disposed on the second free layer 660, and a second fixed layer 680 disposed on the second tunnel barrier 670. The second voltage control electrode 530 is disposed on the second MTJ stack 650.

In some embodiments, the first voltage control electrode 510 and the second voltage control electrode 530 may include the same or similar materials as the voltage control electrode 120, and the write electrode 520 may include the same or similar material as the first write electrode 110 and the second write electrode 130, and thus it will not be repeated herein. In some embodiments, the first free layer 640 and the second free layer 660 may include the same or similar materials as the first free layer 220 and the second free layer 280, and the first barrier tunnel barrier layer 630 and the second tunnel barrier layer 670 may include the same or similar materials as the first barrier tunnel barrier layer 230 and the second tunnel barrier layer 270, and thus it will not be repeated herein.

The first fixed layer 620 and the second fixed layer 680 may be single-layer or multi-layer structures. The first fixed layer 620 and the second fixed layer 680 may include the same or similar materials as the first fixed layer 240 and the second fixed layer 260, and thus it will not be repeated herein. In some embodiments, the first fixed layer 620 and the second fixed layer 680 further include antiferromagnetic layers, wherein the antiferromagnetic layers are used to fix the magnetic orientation of the ferromagnetic material layers in the first fixed layer 620 and the second fixed layer 680. The ferromagnetic material layer in the first fixed layer 620 may be located between the antiferromagnetic layer and the first tunnel barrier layer 630, and the ferromagnetic material layer in the second fixed layer 680 may be located between the antiferromagnetic layer and the second tunnel barrier layer 670.

As shown in FIG. 6, the center of the first MTJ stack 610 is separated from the center of the second MTJ stack 650 by a distance d. The distance d is long enough that the first MTJ stack 610 and the second MTJ stack 650 do not overlap each other. In other words, a projection of the first MTJ stack 610 does not overlap a projection of the second MTJ stack 650 in the top view (e.g., on the X-Y plane).

Figure 7A:
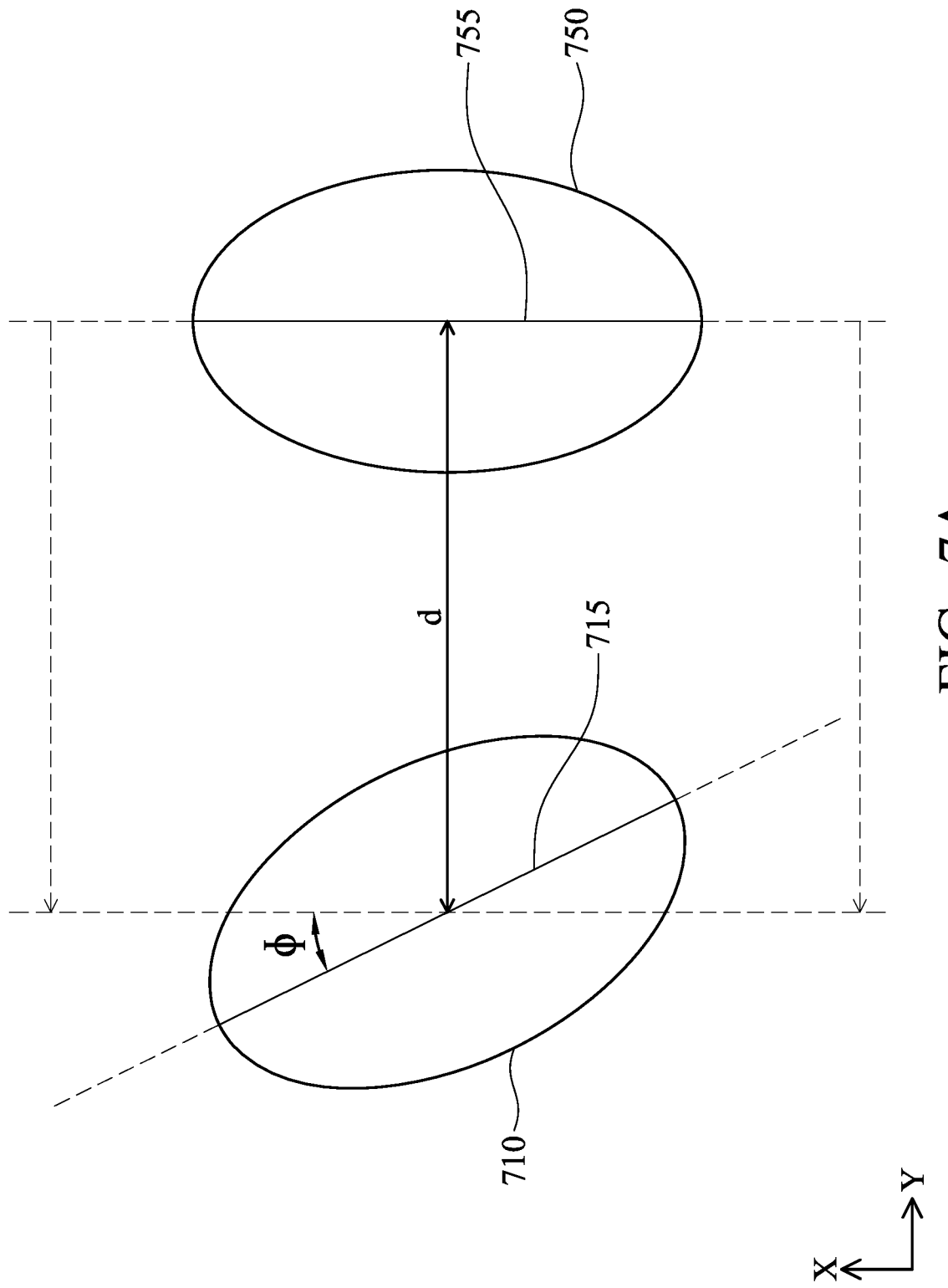
FIGS. 7A and 7B illustrate top views of the memory structure on an X-Y plane, in accordance with some embodiments of the present disclosure.
Figure 7B:
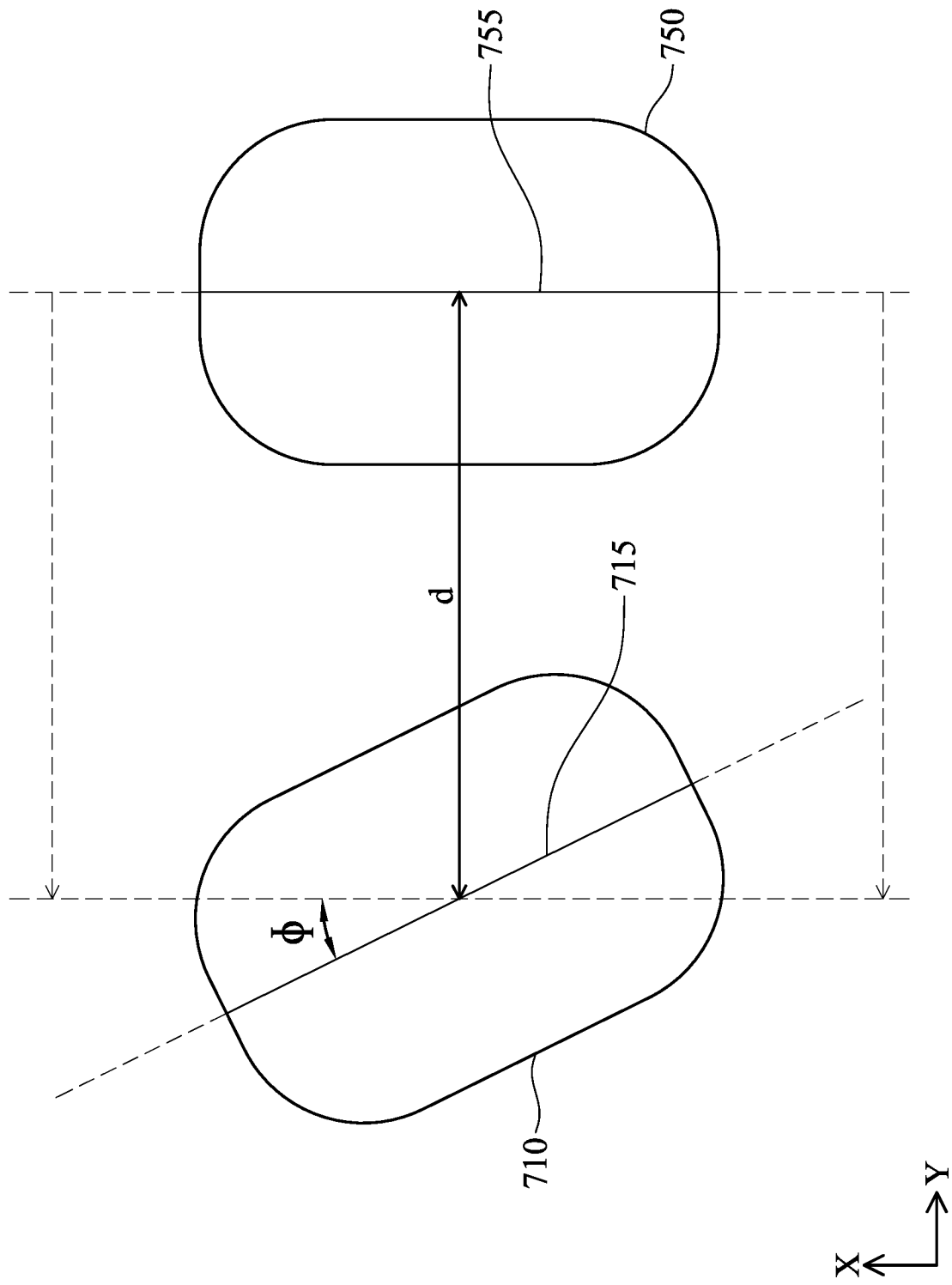

FIGS. 7A and 7B illustrate top views of the memory structure 600 on an X-Y plane, in accordance with some embodiments of the present disclosure. In some embodiments, the first MTJ stack 610 has a first projection 710 on the X-Y plane, and the second MTJ stack 650 has a second projection 750 on the X-Y plane. The shape of the first projection 710 on the X-Y plane includes a first major axis 715 and a first minor axis (not shown), and the shape of the second projection 750 on the X-Y plane includes a second major axis 755 and a second minor axis (not shown). In some embodiments, the first projection 710 and the second projection 750 are elliptical, as shown in FIG. 7A. In some embodiments, the first projection 710 and the second projection 750 are rounded rectangular, as shown in FIG. 7B. However, the shapes of the first projection 710 and the second projection 750 in the present disclosure are not limited to the enumerated ellipse or rounded rectangle.

In some embodiments, the first MTJ stack 610 is rotated at an angle relative to the overlying second MTJ stack 650. Since the first MTJ stack 610 is rotated by the angle relative to the second MTJ stack 650, there is an included angle Φ between the first major axis 715 of the first projection 710 of the first MTJ stack 610 and the second major axis 755 of the second projection 750 of the second MTJ stack 650, as shown in FIG. 7A and FIG. 7B. As described above, the included angle Φ is from −50 degrees to 50 degrees, such as −50 degrees to −5 degrees and 5 degrees to 50 degrees, or −50 degrees to −30 degrees and 30 degrees to 50 degrees.

As described above, for the MTJ stack, the top layer may have worse flatness. For example, the first free layer 640 at the top of the first MTJ stack 610 and the second fixed layer 680 at the top of the second MTJ stack 650 have worse flatness. As described above, a layer having worse flatness will cause the interface between said layer and the electrode connected to it to also have worse flatness. Furthermore, in the MTJ stack in which the interface between the free layer and the write electrode has worse flatness, the relatively greater write current (also referred to as the switching current) is required to switch the magnetic orientation of the free layer. Therefore, in the embodiment shown in FIG. 6, since there is worse flatness between the first free layer 640 and the write electrode 520 thereon, the first free layer 640 of the first MTJ stack 610 requires a greater write current than the second free layer 660 of the second MTJ stack 650 to switch the magnetic orientation.

Refer to FIGS. 7A and 7B, through rotating an MTJ stack that has a free layer on the top and a write electrode disposed on the free layer at an angle, the write current required by the MTJ stack can be reduced. For example, through rotating the first MTJ stack 610 relative to the second MTJ stack 650 by the included angle Φ, the write current required by the first free layer 640 of the first MTJ stack 610 can be reduced. As a result, the increasing write current caused by the worse flatness of the interface between the first free layer 640 and the write electrode 520 thereon can be compensated. In some embodiments, as the absolute value of the included angle Φ increases, the writing current required to switch the free layer can decrease accordingly. By adjusting the rotating angle of the MTJ stack, the write current required by the MTJ stack can be flexibly modified. In this way, each MRAM bit cell in the entire MRAM array may have the same write current as much as possible. Alternatively, the write currents of different MRAM bit cells in the MRAM array can be separately modified according to usage requirements.

As described above, a layer having worse flatness will cause the interface between said layer and the electrode connected to it to also have worse flatness, which in turn will cause the electrode itself to have worse flatness. As previously shown in FIG. 4, the worse flatness of the second free layer 280 not only causes the interface between the second free layer 280 and the second write electrode 130 to have worse flatness, it also causes the second write electrode 130 itself to have worse flatness. In the embodiment shown in FIG. 6, this causes the portion of the write electrode 520 located on the first free layer 640 to have worse flatness.

If a free layer is disposed on the portion with worse flatness of the write electrode, it will also cause to an interface with worse flatness between the free layer and the write electrode, and thus using a greater write current (also referred to as switching current) is required to switch the magnetic orientation of the free layer. In the embodiment shown in FIG. 6, if the second MTJ stack 650 is disposed directly over the first MTJ stack 610, the worse flatness of the portion of the write electrode 520 located on the first free layer 640 will result in the second free layer 660 of the second MTJ stack 650 on the write electrode 520 also has worse flatness. As a result, the write current required by the second free layer 660 of the second MTJ stack 650 will be affected.

As shown in FIGS. 6, 7A, and 7B, the first MTJ stack 610 and the second MTJ stack 650 of the memory structure 600 are separated a distance d away from each other, wherein the distance d is long enough to make sure that the first projection 710 of the first MTJ stack 610 and the second projection 750 of the second MTJ stack 650 do not overlap each other in the top view. At this distance d, the second MTJ stack 650 can avoid being disposed on the uneven portion of the write electrode 520 caused by the first MTJ stack 610, so that the second free layer 660 of the second MTJ stack 650 is disposed on the portion of the write electrode 520 having better flatness. In this way, the worse flatness between the free layer and the write electrode can be avoided from affecting the performance of the MTJ stack.

In the embodiments shown in FIGS. 5-7B, the first MTJ stack 610 and the second MTJ stack 650 are illustrated as being separate from each other in the Y direction. However, in other embodiments, the first MTJ stack 610 and the second MTJ stack 650 may be separate from each other in other directions, such as the X direction or a direction that is not parallel to the X direction and the Y direction.

The embodiments of the present disclosure provide many advantages for the memory structure of MRAM. Through rotating an MTJ stack that has a free layer on the top and a write electrode disposed on the free layer at an angle, the write current required by the MTJ stack can be reduced. As a result, the increasing write current caused by the worse flatness between the free layer and the write electrode thereon can be compensated. By adjusting the rotating angle of an MTJ stack, the write current required by the MTJ stack can be flexibly modified. In this way, each MRAM bit cell in the entire MRAM array may have the same write current as much as possible, alternatively, the write currents of different MRAM bit cells in the MRAM array can be separately modified according to usage requirements. Furthermore, in the case where a free layer of a lower MTJ stack is disposed on the top and causes a write electrode on the lower MTJ stack to be uneven, by shifting an upper MTJ stack by a certain distance to avoid overlapping the lower MTJ stack, a free layer of the upper MTJ stack can be prevented from being disposed on the uneven write electrode. In this way, the worse flatness between the free layer and the write electrode can be avoided from affecting the performance of the MTJ stack.

A three-dimensional MRAM array with more layers can be stacked further, according to the principles provided by the present disclosure. These principles include rotating the MTJ stack that has a free layer on the top and a write electrode disposed on the free layer at an angle, and shifting an upper MTJ stack disposed on a write electrode on a lower MTJ stack by a certain distance. Therefore, utilizing the embodiments of the present disclosure, it is possible to manufacture a higher density three-dimensional MRAM array while providing the advantages mentioned above.

Figure 8:
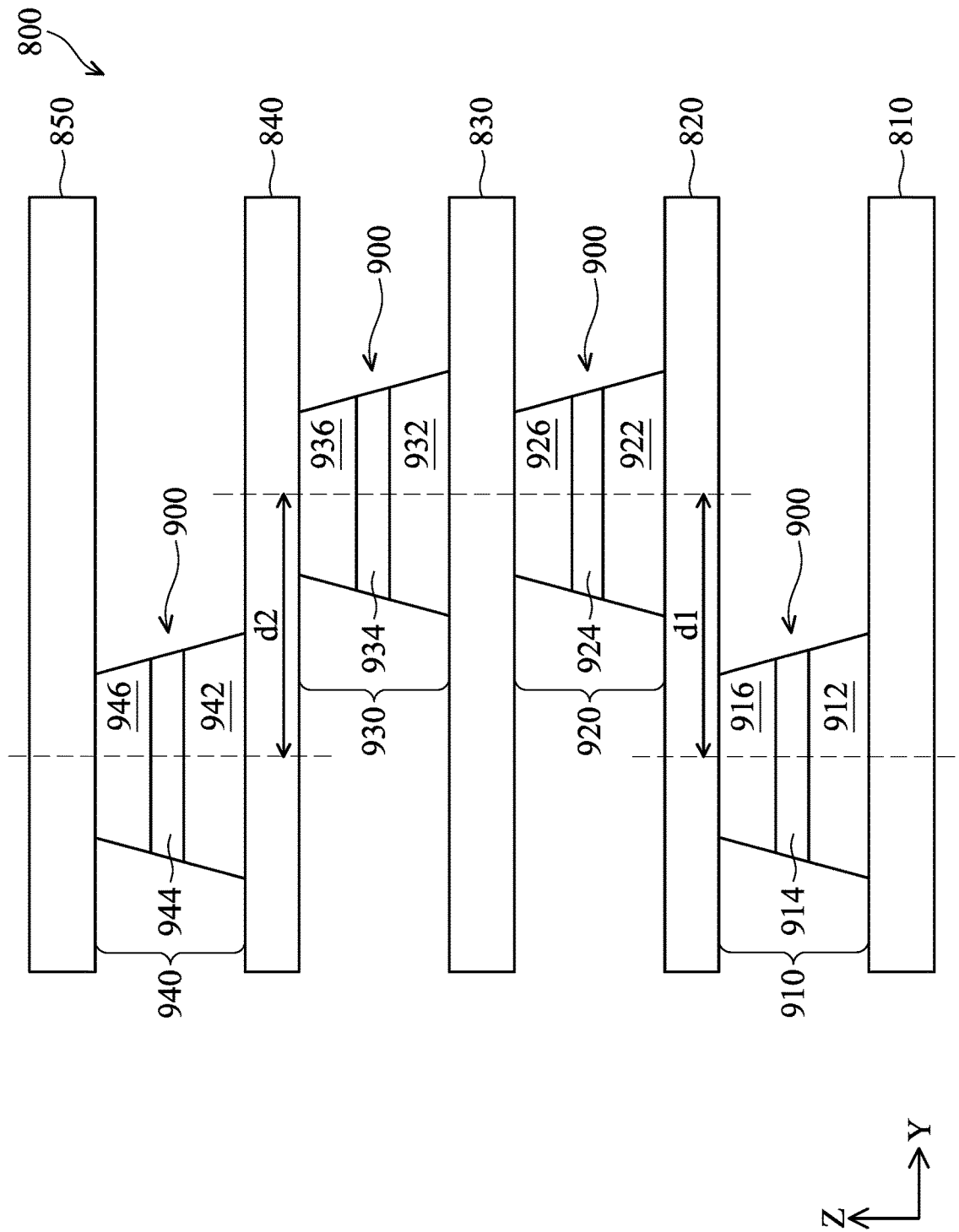
FIG. 8 illustrates a schematic diagram of a memory structure, in accordance with some embodiments of the present disclosure.

FIG. 8 illustrates a memory structure 800 for a three-dimensional MRAM array with more layers according to the principles provided by the present disclosure. It should be noted that, the memory structure 800 only shows four layers of MRAM bit cells as an example. However, according to the principles provided by the present disclosure, the three-dimensional MRAM array may have more layers of MRAM bit cells.

Refer to FIG. 8, the memory structure 800 includes a first voltage control electrode 810, a first MRAM bit cell 900 disposed on the first voltage control electrode 810, a first write electrode 820 disposed on the first MRAM bit cell 900, a second MRAM bit cell 900 disposed on the first write electrode 820, a second voltage control electrode 830 disposed on the second MRAM bit cell 900, a third MRAM bit cell 900 disposed on the second voltage control electrode 830, a second write electrode 840 disposed on the third MRAM bit cell 900, a fourth MRAM bit cell 900 disposed on the second write electrode 840, and a third voltage control electrode 830 disposed on the fourth MRAM bit cell 900.

The first MRAM bit cell 900 includes a first MTJ stack 910, the second MRAM bit cell 900 includes a second MTJ stack 920, the third MRAM bit cell 900 includes a third MTJ stack 930, and the fourth MRAM bit cell 900 includes a fourth MTJ stack 940. As described above, for the purpose of simplicity, the present disclosure only uses MTJ stacks to represent MRAM bit cells.

In some embodiments, the first MTJ stack 910 includes a first fixed layer 912 disposed on the first voltage control electrode 810, a first tunnel barrier layer 914 disposed on the first fixed layer 912, and a first free layer 916 disposed on the first tunnel barrier layer 914. The first write electrode 820 is disposed on the first MTJ stack 910. The second MTJ stack 920 includes a second free layer 922 disposed on the first write electrode 820, a second tunnel barrier layer 924 disposed on the second free layer 922, and a second fixed layer 926 disposed on the second tunnel barrier layer 924. The second voltage control electrode 830 is disposed on the second MTJ stack 920. The third MTJ stack 930 includes a third fixed layer 932 disposed on the second voltage control electrode 830, a third tunnel barrier layer 934 disposed on the third fixed layer 932, and a third free layer 936 disposed on the third tunnel barrier layer 934. The second write electrode 840 is disposed on the third MTJ stack 930. The fourth MTJ stack 940 includes a fourth free layer 942 disposed on the second write electrode 840, a fourth tunnel barrier layer 944 disposed on the fourth free layer 942, and a fourth fixed layer 946 disposed on the fourth tunnel barrier layer 944. The third voltage control electrode 850 is disposed on the fourth MTJ stack 940.

In some embodiments, the first voltage control electrode 810, the second voltage control electrode 830, and the third voltage control electrode 850 may include the same or similar materials as the voltage control electrode 120, and the first write electrode 820 and the second write electrode 840 may include the same or similar materials as the first write electrode 110 and the second write electrode 130, and thus it will not be repeated herein.

In some embodiments, the first free layer 916, the second free layer 922, the third free layer 936, and the fourth free layer 942 may include the same or similar materials as the first free layer 220 and the second free layer 280, and the first barrier tunnel barrier layer 914, the second tunnel barrier layer 924, the third tunnel barrier layer 934, and the fourth tunnel barrier layer 944 may include the same or similar materials as the first barrier tunnel barrier layer 230 and the second tunnel barrier layer 270, and thus it will not be repeated herein. The first fixed layer 912, the second fixed layer 926, the third fixed 932, and the fourth fixed layer 946 may be single-layer or multi-layer structures, and may include the same or similar materials as the first fixed layer 240 and the second fixed layer 260, and thus it will not be repeated herein.

The principles described above include rotating an MTJ stack that has a free layer on the top and a write electrode disposed on the free layer at an angle. Therefore, in the embodiment shown in FIG. 8, the first MTJ stack 910 is rotated at an angle relative to the second MTJ stack 920, and the third MTJ stack 930 is rotated at an angle relative to the second MTJ stack 920 and/or the fourth MTJ stack 940. In other words, on the X-Y plane, there is a first included angle between an major axis of a projection of the first MTJ stack 910 and an major axis of a projection of the second MTJ stack 920, and there is a second included angle between an major axis of a projection of the third MTJ stack 930 and an major axis of a projection of the second MTJ stack 920 and/or the fourth MTJ stack 940. The first included angle and the second included angle may be the same or different, and have the same range as the included angle Φ described above.

The principles described above include shifting, by a certain distance, the upper MTJ stack disposed on the write electrode, wherein said write electrode is disposed on the lower MTJ stack. Therefore, in the embodiment shown in FIG. 8, the second MTJ stack 920 disposed on the first write electrode 820 disposed on the first MTJ stack 910 is shifted, and the fourth MTJ stack 940 disposed on the second write electrode 840 disposed on the third MTJ stack 930 is shifted. The center of the first MTJ stack 910 is separated from the center of the second MTJ stack 920 by a first distance d1, wherein the first distance d1 is long enough to make sure that the projection of the first MTJ stack 910 and the projection of the second MTJ stack 920 do not overlap each other on the X-Y plane. The center of the third MTJ stack 930 is separated from the center of the fourth MTJ stack 940 by a second distance d2, wherein the second distance d2 is long enough to make sure that the projection of the third MTJ stack 930 and the projection of the fourth MTJ stack 940 do not overlap each other on the X-Y plane. The first distance d1 and the second distance d2 may be the same or different.

In the embodiment shown in FIG. 8, the first distance d1 and the second distance d2 are illustrated as extending in the Y direction. However, in other embodiments, the first distance d1 and the second distance d2 may extend in other directions, such as the X direction or a direction that is not parallel to the X direction or the Y direction.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic random access memory (MRAM) structure, comprising:
   a first write electrode;
   a first magnetic tunnel junction (MTJ) stack, including a first free layer disposed on the first write electrode, a first tunnel barrier layer disposed on the first free layer, and a first fixed layer disposed on the first tunnel barrier layer;
   a voltage control electrode, disposed on the first MTJ stack;
   a second MTJ stack, including a second fixed layer disposed on the voltage control electrode, a second tunnel barrier layer disposed on the second fixed layer, and a second free layer disposed on the second tunnel barrier layer; and
   a second write electrode, disposed on the second MTJ stack.

2. The MRAM structure as claimed in claim 1, wherein the first MTJ stack has a first projection with a first major axis in a top view, and the second MTJ stack has a second projection with a second major axis in the top view, wherein there is an included angle between the first major axis and the second major axis.

3. The MRAM structure as claimed in claim 2, wherein the first major axis extends in a second direction.

4. The MRAM structure as claimed in claim 2, wherein the included angle is between 5 degrees and 50 degrees or between −5 degrees and −50 degrees.

5. The MRAM structure as claimed in claim 2, wherein the first projection and the second projection are elliptical.

6. The MRAM structure as claimed in claim 2, wherein the first projection and the second projection are rounded rectangular.

7. The MRAM structure as claimed in claim 1, wherein the first write electrode and the second write electrode extend in a first direction, and the voltage control electrode extends in a second direction, wherein the first direction is substantially perpendicular to the second direction.

8. The MRAM structure as claimed in claim 1, further comprising:
   a first write transistor, connected to the first write electrode;
   a read transistor, connected to the voltage control electrode; and
   a second write transistor, connected to the second write electrode.

9. The MRAM structure as claimed in claim 1, wherein the voltage control electrode is a first voltage control electrode, and the MRAM structure further comprises:
   a third MTJ stack, including a third free layer disposed on the second write electrode, a third tunnel barrier layer disposed on the third free layer, and a third fixed layer disposed on the third tunnel barrier layer; and a second voltage control electrode, disposed on the third MTJ stack.

10. The MRAM structure as claimed in claim 9, wherein a center of the second MTJ stack is spaced a distance apart from a center of the third MTJ stack in a first direction, so that a second projection of the second MTJ stack does not overlap a third projection of the third MTJ stack in a top view.

11. A magnetic random access memory (MRAM) structure, comprising:
 a first voltage control electrode;
 a first magnetic tunnel junction (MTJ) stack, including a first fixed layer disposed on the first voltage control electrode, a first tunnel barrier layer disposed on the first fixed layer, and a first free layer disposed on the first tunnel barrier layer;
 a write electrode, disposed on the first MTJ stack;
 a second MTJ stack, including a second free layer disposed on the write electrode, a second tunnel layer disposed on the second free layer, and a second fixed layer disposed on the second tunnel barrier layer; and
 a second voltage control electrode, disposed on the second MTJ stack.

12. The MRAM structure as claimed in claim 11, wherein a center of the first MTJ stack is spaced a distance apart from a center of the second MTJ stack in a first direction, so that a first projection of the first MTJ stack does not overlap a second projection of the second MTJ stack in a top view.

13. The MRAM structure as claimed in claim 11, wherein the first MTJ stack has a first projection with a first major axis in a top view, and the second MTJ stack has a second projection with a second major axis in the top view, wherein there is an included angle between the first major axis and the second major axis.

14. The MRAM structure as claimed in claim 13, wherein the included angle is between 5 degrees and 50 degrees or between −5 degrees and −50 degrees.

15. The MRAM structure as claimed in claim 13, wherein the first projection and the second projection are elliptical.

16. The MRAM structure as claimed in claim 13, wherein the first projection and the second projection are rounded rectangular.

17. The MRAM structure as claimed in claim 11, wherein the write electrode extends along in a first direction, and the first voltage control electrode and the second voltage control electrode extend in a second direction, wherein the first direction is substantially perpendicular to the second direction.

18. The MRAM structure as claimed in claim 11, further comprising:
 a first read transistor, connected to the first voltage control electrode;
 a write transistor, connected to the write electrode; and
 a second read transistor, connected to the second voltage control electrode.

19. The MRAM structure as claimed in claim 11, wherein the write electrode is a first write electrode, and the MRAM structure further comprises:
 a third MTJ stack, including a third fixed layer disposed on the second voltage control electrode, a third tunnel barrier layer disposed on the third fixed layer, and a third free layer disposed on the third tunnel barrier layer; and
 a second write electrode, disposed on the third MTJ stack.

20. The MRAM structure as claimed in claim 19, wherein the third MTJ stack has a third projection with a third major axis in a top view, and the second MTJ stack has a second projection with a second major axis in the top view, wherein there is an included angle between the second major axis and the third major axis.

* * * * *